United States Patent
Yun et al.

(10) Patent No.: US 7,684,942 B2
(45) Date of Patent: Mar. 23, 2010

(54) BATTERY MANAGEMENT SYSTEM AND DRIVING METHOD THEREOF

(75) Inventors: Han-Seok Yun, Yongin-si (KR);
Soo-Seok Choi, Yongin-si (KR);
Young-Jo Lee, Yongin-si (KR);
Yong-Jun Tae, Yongin-si (KR);
Se-Wook Seo, Yongin-si (KR);
Gye-Jong Lim, Yongin-si (KR);
Beom-Gyu Kim, Yongin-si (KR);
Ho-Young Park, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 259 days.

(21) Appl. No.: 11/851,032

(22) Filed: Sep. 6, 2007

(65) Prior Publication Data
US 2008/0103709 A1     May 1, 2008

(30) Foreign Application Priority Data
Nov. 1, 2006  (KR) .................... 10-2006-0107225

(51) Int. Cl.
*G01F 19/00*     (2006.01)

(52) U.S. Cl. ........................................................ 702/63

(58) Field of Classification Search ............... 702/63, 702/64, 182–185, 188
See application file for complete search history.

(56) References Cited

U.S. PATENT DOCUMENTS

2005/0084745 A1 *  4/2005  Colello et al. ................. 429/61

FOREIGN PATENT DOCUMENTS

KR          2007-3631       1/2007

\* cited by examiner

*Primary Examiner*—Edward Raymond
(74) *Attorney, Agent, or Firm*—Stein McEwen, LLP

(57) ABSTRACT

A battery management system and a driving method thereof includes a sensing unit and a micro control unit (MCU). The sensing unit measures a battery temperature and a battery current. The MCU receives the battery temperature and current, detects battery internal resistance corresponding to an estimated state of charge (SOC) and the battery temperature when the estimated SOC is included within an SOC area corresponding to the transmitted battery temperature, and estimates a battery state of health (SOH) by using the battery internal resistance. In the SOC area, a variation of the battery internal resistance is minimized.

17 Claims, 4 Drawing Sheets

BATTERY MANAGEMENT SYSTEM AND DRIVING METHOD THEREOF

CROSS-REFERENCE TO RELATED APPLICATION

This application claims priority to and the benefit of Korean Patent Application No. 2006-107225 filed in the Korean Intellectual Property Office on Nov. 1, 2006, the entire contents of which are incorporated herein by reference.

BACKGROUND OF THE INVENTION

1. Field of the Invention

Aspects of the present invention relate to a battery management system. More particularly, aspects of the present invention relate to a battery management system used in a vehicle using electrical energy, and a driving method thereof.

2. Description of the Related Art

Vehicles that use internal combustion engines fueled by gasoline or heavy oil have caused serious air pollution. Accordingly, companies have made various efforts to develop electric and hybrid vehicles to reduce air pollution.

An electric vehicle uses a battery motor operating by electrical energy output from a battery. Since the electric vehicle is primarily driven by the battery, which is formed out of one battery pack including a plurality of rechargeable and dischargeable secondary cells, there is merit in that the electric vehicle does not emit emission gases and makes less noise.

The term "hybrid vehicle" commonly refers to a gasoline-electric hybrid vehicle that uses gasoline to power an internal-combustion engine and an electric battery to power an electric motor. Recently, companies have developed various kinds of hybrid vehicles, including hybrid vehicles using an internal-combustion engine and fuel cells and hybrid vehicles using a battery and fuel cells have been developed. The fuel cells directly obtain electrical energy by generating a chemical reaction while hydrogen and oxygen are continuously provided.

Since companies are increasing the number of rechargeable cells used in hybrid vehicles to improve a power source of the vehicles, and since the rechargeable cells directly affect the performance of the vehicle, it is important to increase the performance of the respective battery cells. In order to increase performance, hybrid vehicles should include a battery management system (BMS) to measure voltages of the respective cells and the voltage and current of an entire battery including the respective cells, and to efficiently manage a charging and discharging lifespan.

Particularly, internal resistance of the battery reduces an output of the battery and deteriorates the performance of the battery, and is used as a reference to determine the lifespan and a state of health (SOH) of the battery. In addition, the internal resistance varies according to a temperature of the battery and a state of charging (SOC). Accordingly, when the SOC is within an SOC area in which a variation of the internal resistance is minimized for a given battery temperature, the battery internal resistance may be more precisely detected.

The above information disclosed in this Background section is only for enhancement of understanding of the background of the invention and therefore it may contain information that does not form the prior art that is already known in this country to a person of ordinary skill in the art.

SUMMARY OF THE INVENTION

Aspects of the present invention have been made in an effort to provide a battery management system to more precisely detect a battery internal resistance by using a predetermined state of charge area of a battery, and a method thereof.

According to an aspect of the invention, a battery management system includes a sensing unit and a micro control unit (MCU). According to an aspect, the sensing unit measures a battery temperature and a battery current. According to an aspect, the MCU estimates a state of charge (SOC) based on the battery current, calculates a battery internal resistance corresponding to the estimated SOC and the battery temperature according to whether the estimated SOC is included within an SOC area, and estimates a battery state of health (SOH) by using the battery internal resistance.

According to an aspect, in the SOC area, a variation of the battery internal resistance is minimized.

According to an aspect, the MCU uses $$I = \frac{Vocv - Vcutoff}{Rb}$$

to calculate a maximum discharge current of the battery, uses $$P = I \times Vcutoff$$

to calculate a battery power value, and uses the calculated maximum discharge current and the battery power value to estimate the battery SOH, wherein I denotes the maximum discharge current, Vocv denotes an open circuit voltage (OCV) of the battery in a key-on state, Vcutoff denotes a permissible low battery voltage, Rb denotes the battery internal resistance, and P denotes the battery power value. According to an aspect, the MCU determines that the battery SOH is included within a normal range when a ratio of the battery power value P to a fresh battery power value is greater than a first threshold value, and determines that the battery is depleted when the ratio of the battery power value P to the fresh battery power is lower than the first threshold value. According to an aspect, the MCU determines that the battery SOH is included within the normal range when a ratio of the battery power value P to a previous battery power is greater than a second threshold value, and determines that the battery is depleted when the ratio of the battery power value P to the previous battery power value is lower than the second threshold value.

According to another aspect of the invention, a driving method of a battery management system which manages a battery includes determining whether an estimated state of charge (SOC) of the battery is included within a first SOC area corresponding to a temperature of the battery, calculating a battery internal resistance corresponding to the estimated SOC and the battery temperature according to the determining of whether the estimated SOC is included within the SOC area, and determining a battery state of health (SOH) based on the battery internal resistance.

According to another aspect, in the first SOC area, a variation of the battery internal resistance is minimized.

According to another aspect, the determining of the battery SOH includes calculating a maximum discharge current of the battery by using $$I = \frac{Vocv - Vcutoff}{Rb},$$

and calculating a battery power value by using $$P = I \times Vcutoff,$$

wherein I denotes the maximum discharge current, Vocv denotes an open circuit voltage of the battery in a key-on state, Vcutoff denotes a permissible low battery voltage, Rb denotes the battery internal resistance, and P denotes the battery power value.

According to another aspect, the determining of the battery SOH includes determining that the battery SOH is included within a normal range when a ratio of a battery power value to a fresh battery power value is greater than a first threshold value, and determining that the battery is depleted when the ratio of the battery power value to the fresh battery power value is lower than the first threshold value. According to another aspect, the determining of the battery SOH further includes determining that the battery SOH is included within a normal range when a ratio of a battery power value to a previous battery power value is greater than a second threshold value, and determining that the battery is depleted when the ratio of the battery power value to the previous battery power value is lower than the second threshold value.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
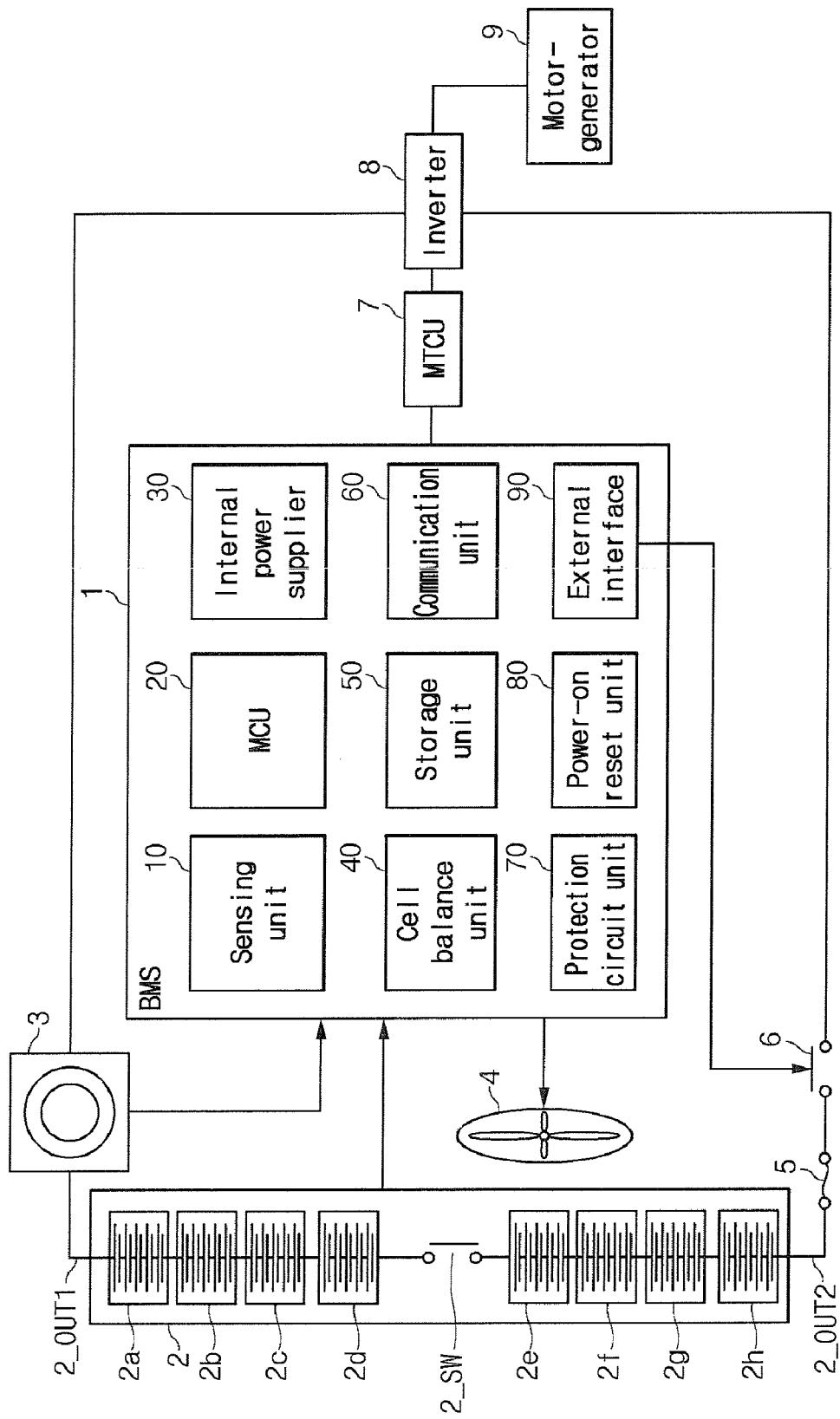
FIG. 1 shows a diagram of a configuration of a hybrid vehicle system according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Throughout this specification and the claims that follow, when an element is described as "coupled" to another element, the element may be "directly coupled" to the other element or "electrically coupled" to the other element through a third element or multiple other elements.

Throughout this specification and the claims which follow, unless explicitly described to the contrary, the word "comprise," and variations such as "comprises" or "comprising," will be understood to imply the inclusion of stated elements but not the exclusion of any other elements.

FIG. 1 shows a diagram of a configuration of a hybrid vehicle system according to an embodiment of the present invention. As shown in FIG. 1, the hybrid electric vehicle system includes a battery management system 1, a battery 2, a current sensor 3, a cooling fan 4, a fuse 5, a main switch 6, a motor control unit (MTCU) 7, an inverter 8, and a motor generator 9. It is understood that the hybrid electric vehicle system according to aspects of the invention may have other components instead of or in addition to those components shown in FIG. 1 and described below.

The battery 2 includes a plurality of sub-packs 2a, 2b, 2c, 2d, 2e, 2f, 2g and 2h, each having a plurality of battery cells coupled in series to each other, an output terminal 2_OUT1, an output terminal 2_OUT2, and a safety switch 2_SW provided between the sub-pack 2d and the sub-pack 2e. While 8 sub-packs 2a, 2b, 2c, 2d, 2e, 2f, 2g and 2h are exemplified and each sub-pack includes a plurality of battery cells according to an embodiment of the present invention, it is not limited thereto. The battery 2 may instead have more or less than eight sub-packs, and each sub-pack may only have one battery cell. In addition, the safety switch 2_SW is manually turned on and off to guarantee the safety of a worker when performing operations on the battery 2 or replacing the battery 2.

In an embodiment of the present invention, the safety switch 2_SW is disposed between the sub-pack 2d and the sub-pack 2e, but it is not limited thereto. The safety switch 2_SW may instead be located between other sub-packs or elsewhere. The output terminal 2_OUT1 and the output terminal 2_OUT2 are coupled to the inverter 8.

The current sensor 3 measures an output current value of the battery 2 and outputs the measured output current value to a sensing unit 10 of the BMS 1. In further detail, the current sensor 3 may take different forms, such as a hall current transformer (Hall CT) using a hall element to measure a current value and outputting an analog current signal corresponding to the measured current value, or a shunt resistor to output a voltage signal for a current flowing through a resistor provided in a load line. It is understood that various types of current sensors other than a Hall CT or a shunt resistor may be used to measure the output current value of the battery 2.

The cooling fan 4 cools down heat generated by charging and discharging the battery 2 which is initiated in response to a control signal of the BMS 1, prevents the battery 2 from deteriorating due to a temperature increase, and prevents charging and discharging efficiency from deteriorating.

The fuse 5 prevents an overflowing current, which may be caused by a disconnection or a short circuit of the battery 2, from being transmitted to the battery 2. That is, when an overcurrent is generated, the fuse 5 is disconnected so as to interrupt the current from overflowing.

The main switch 6 turns the battery 2 on and off in response to the control signal of the BMS 1 or a control signal of the MTCU 7 when an unusual phenomenon, including an over-flowed voltage, an over-current, or a high temperature, occurs.

The BMS 1 includes a sensing unit 10, a main control unit (MCU) 20, an internal power supplier 30, a cell balance unit 40, a storage unit 50, a communication unit 60, a protection circuit unit 70, a power-on reset unit 80, and an external interface 90. It is understood that the BMS 1 may have other components instead of or in addition to those shown in FIG. 1 and described below, and that the components shown in FIG. 1 may be arranged in a different configuration, for example, the sensing unit 10 and the internal power supplier 30 may be switched.

The sensing unit 10 measures a battery voltage V, a battery current i, and a battery temperature T and transmits the measured values to the MCU 20.

The MCU 20 estimates a state of charge (SOC) and a state of health (SOH) based on the battery voltage V, the battery current i, and the battery temperature T, and controls a charging and discharging state of the battery 2. Particularly, the MCU 20 detects internal resistance of the battery 2, and determines the SOH based on the detected internal resistance. The BMS 1 according to an embodiment of the present invention stores a first table relating to the battery internal resistance corresponding to the temperature T and SOC of the battery 2. In addition, the MCU 20 according to an embodiment of the present invention sets an estimation SOC area, in which a variation of the internal resistance according to a variation of an estimated SOC is minimized, as a first SOC area among data of the first table.

Further, the MCU 20 sets another estimation SOC area, in which the variation of the internal resistance is greater than a variation of the first SOC area, as a second SOC area. This second SOC area may be multiple areas, and in an embodiment includes second SOC area I and second SOC area II in an embodiment of the present invention. In further detail, the MCU 20 receives a current temperature T of the battery 2 from the sensing unit 10, and receives a current estimated SOC from an SOC estimating unit 210 (shown in FIG. 2). Then, the MCU 20 determines whether the estimated SOC is within the first SOC area corresponding to the current temperature T. In this case, when the estimated SOC is within one of the second SOC areas I or II, the MCU 20 does not detect the battery internal resistance. However, when the estimated SOC is within the first SOC area, the MCU 20 detects the battery internal resistance corresponding to the current battery temperature T and the estimated SOC based on the first table. In addition, the MCU 20 calculates a maximized discharging current I and power P of the battery 2 based on the battery internal resistance to estimate the SOH of the battery 2.

The internal power supplier 30, also known as the power source, supplies power to the BMS 1 by using a backup battery (not shown). The cell balance unit 40 balances the state of charge of each cell. That is, cells sufficiently charged are discharged, and cells relatively less charged are further charged. The storage unit 50 stores data of the current SOC and SOH when the power source of the BMS 1 is turned off. Here, an electrically erasable programmable read-only memory (EEPROM) may be used for the storage unit 50. However, it is understood that other types of memories, such as flash drives or other types of non-volatile storage memories, may be used instead of an EEPROM.

The communication unit 60 communicates with the MTCU 7 of the vehicle. That is, the communication unit 60 transmits information of the SOC and SOH to the MTCU 7, or receives information on a state of the vehicle from the MTCU 7 and transmits the information to the MCU 20. The protection circuit unit 70 is a secondary circuit provided to protect the battery 2 from over-flowed currents and over-charged voltage by using a hardware element (not shown). The hardware element in the protection circuit unit 70 is preferably, but not necessarily, a type of firmware. The power-on reset unit 80 resets the overall system when the power source of the BMS 1 is turned on. The external interface 90 couples auxiliary devices used with the BMS 1, such as the cooling fan 4 and main switch 6, to the MCU 20. While the cooling fan 4 and the main switch 6 are shown as the only BMS auxiliary devices in an exemplary embodiment of the present invention, the present invention is not limited thereto, and may include various other types of auxiliary devices, such as other temperature regulating devices, other switches and fuses, and other sensors.

The MTCU 7 determines a current vehicle driving state based on information about an accelerator pedal, a break pedal, and a vehicle speed, and determines a required torque state based on the information. According to an aspect, the current vehicle driving state including factors such as a key on state for starting an engine, a key off state for turning off the engine, a cruise driving state, and an acceleration driving state. The MTCU 7 transmits the vehicle information to the communication unit of the BMS 1. The MTCU 7 controls an output of the motor-generator 9 to correspond to the torque information. That is, the MTCU 7 controls a switching operation of the inverter 8 so that the output of the motor-generator 9 corresponds to the torque information. In addition, the MTCU 7 receives the SOC of the battery 2 from the MCU 20 through the communication unit 60 of the BMS 1, and controls the SOC to maintain a target level, e.g., 55%. For example, when the SOC level transmitted from the MCU 20 is lower than 55%, the MTCU 7 controls a switch of the inverter 8 so as to output power toward the battery 2 and charge the battery 2. In this case, the battery current may be set to be a negative value (−). When the SOC level is greater than 55%, the MTCU 7 controls the switch of the inverter 8 to output the power toward the motor generator 9 and discharge the battery 2. In this case, the battery current may be set to be a positive value (+).

The inverter 8 controls the battery 2 to be charged or discharged in response to the control signal of the MTCU 7.

The motor generator 9 converts the electrical energy of the battery 2 into mechanical energy to drive the vehicle based on the torque information transmitted from the MTCU 7, and converts the mechanical energy of the vehicle into electrical energy to charge the battery 2. The motor generator 9 may be any type commonly used with hybrid vehicles.

Accordingly, since the MTCU 7 charges and discharges the battery 2 based on the SOC level to prevent the battery 2 from being overcharged or over-discharged, the battery 2 may be efficiently used for a long time. However, since it is difficult to measure an actual SOC level of the battery 2 when the battery 2 is mounted on the vehicle, the BMS 1 instead should precisely estimate the SOC level by using the battery current and battery voltage sensed by the sensing unit 10 and to transmit this precisely estimated SOC to the MTCU 7.

A method for estimating the SOH according to an embodiment of the present invention will be described with reference to FIG. 2 and FIG. 3.

Figure 2:
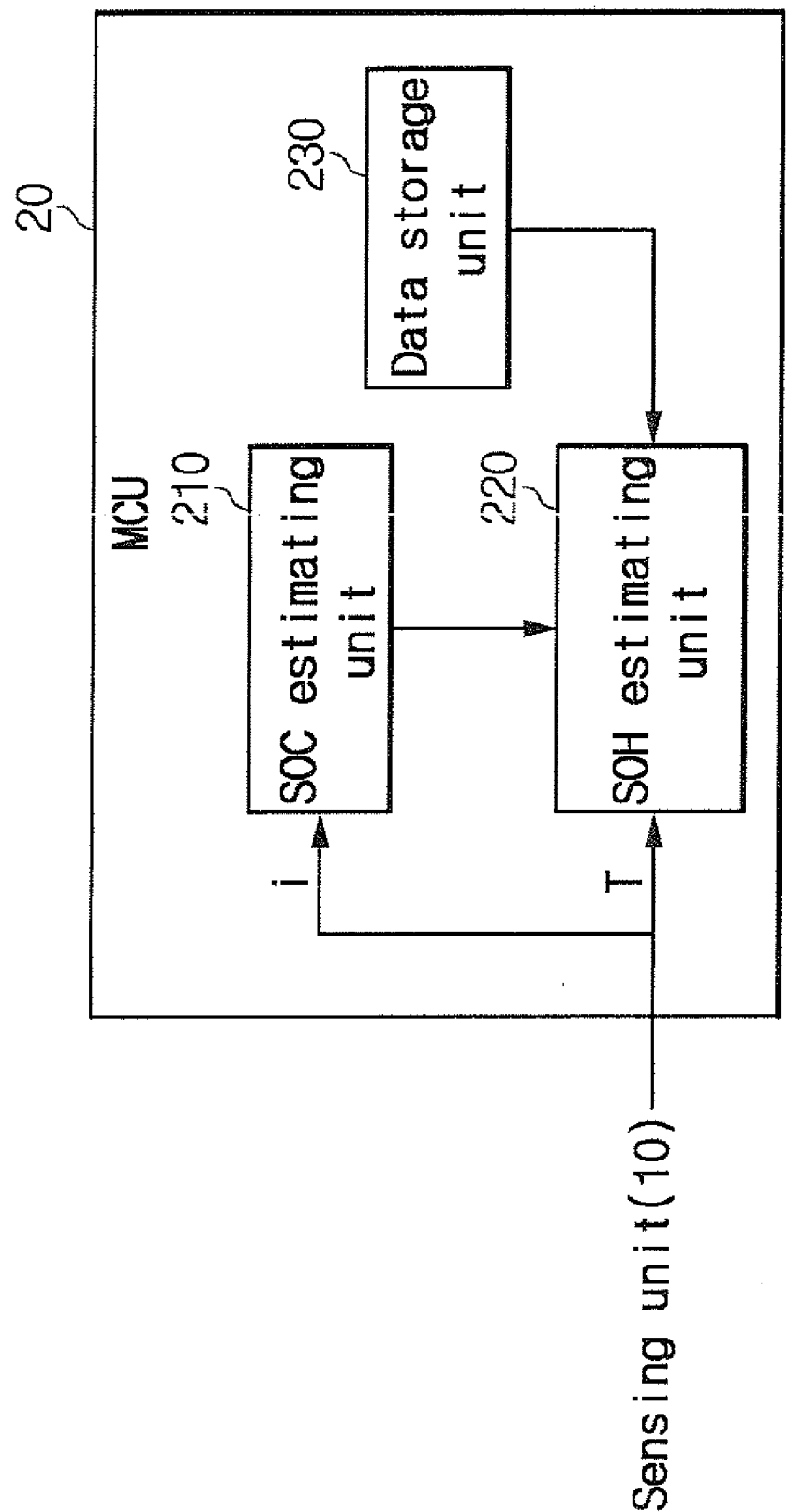
FIG. 2 shows a diagram representing the sensing unit and the main control unit (MCU) shown in FIG. 1.

FIG. 2 shows a diagram representing the sensing unit 10 and the MCU 20 according to an embodiment of the present invention.

As shown in FIG. 2, the MCU 20 according to an embodiment of the present invention detects the battery internal resistance based on the battery temperature T and battery current i measured by the sensing unit 10. The MCU 20 includes an SOC estimating unit 210, a data storage unit 220, and an SOH estimating unit 230.

The SOC estimating unit 210 receives the battery current i from the sensing unit 10. In addition, the SOC estimating unit 210 integrates the battery current i to a current value to estimate the SOC.

The data storage unit 220 stores information on battery states when the vehicle is in motion as well as when the vehicle is stopped. In further detail, the data storage unit 220 stores a first table of the internal resistance of the battery 2 corresponding to the estimated SOC and the battery temperature T. The first table according to an embodiment of the present invention includes experimental data including the measured temperature T, the estimated SOC, and the corresponding internal resistance of the battery 2. The data storage unit 220 stores a second table of a fresh battery power value which is calculated by using measured fresh battery internal resistance. The data storage unit 220 can be various different types of memories, including, for example, a non-volatile memory such as a flash drive, or a volatile memory such as a RAM.

In further detail, the data storage unit 220 calculates an estimated SOC corresponding to a fresh battery temperature, and uses fresh battery internal resistance corresponding to the calculated estimated SOC to calculate the fresh battery power value. The second table is generated according to the above result, and is stored in the data storage unit 220. Further, the data storage unit 220 stores an open circuit voltage (OCV) Vocv of the battery 2 in a key-on state, i.e., when the vehicle is turned on, and also stores a permissible low battery voltage Vcutoff. The OCV is used to detect a maximum discharge current I. Additionally, the data storage unit 220 stores a previous battery power value. The previous battery power value is calculated by using previous battery internal resistance calculated when a previously calculated estimated SOC is included within the first SOC area corresponding to a previous battery temperature T.

The SOH estimating unit 230 uses a current battery temperature T and a current estimated SOC to detect the battery internal resistance, and uses the detected internal resistance to determine an SOH of the battery 2. In further detail, the SOH estimating unit 230 receives the current battery temperature T from the sensing unit 10, and receives the current estimated SOC from the SOC estimating unit 210. Then, the SOH estimating unit 230 determines whether the estimated SOC is included within the first SOC area corresponding to the current battery temperature T. In this case, when the estimated SOC is included within the second SOC area, which has sub-areas I and II, the SOH estimating unit 230 does not detect the battery internal resistance. When the estimated SOC is within the first SOC area, the SOH estimating unit 230 uses the first table to detect the battery internal resistance corresponding to the estimated SOC and the current battery temperature T. In this case, the SOH estimating unit 230 uses the battery internal resistance to calculate the maximum discharge current I of the battery 2, which is determined using Equation 1.

$$I = \frac{Vocv - Vcutoff}{Rb} \quad \text{[Equation 1]}$$

Here, Vocv denotes an OCV of the battery 2 in the key-on state, Vcutoff denotes a permissible low battery voltage, and Rb denotes the internal resistance of the battery 2. In addition, the SOH estimating unit 230 uses the calculated maximum discharge current I to calculate a battery power value P, which is determined using Equation 2.

$$P = I \times Vcutoff \quad \text{[Equation 2]}$$

Here, I denotes a maximum discharge current, and Vcutoff denotes a permissible low battery voltage. Accordingly, the SOH estimating unit 230 uses the calculated battery power value P to determine the battery SOH.

In an embodiment of the present invention, two methods are used to determine the battery SOH. According to a first method to determine the battery SOH by using the SOH estimating unit 230, a ratio of the fresh battery power value to the battery power value P is compared to a first threshold value. The SOH estimating unit 230 determines that the battery SOH is included within a normal range when the ratio of the fresh battery power value to the battery power value P is greater than the first threshold value. On the other hand, the SOH estimating unit 230 determines that the battery SOH is low, i.e., the battery 2 is out, when the ratio of the fresh battery power value to the battery power value P is lower than the first threshold value.

According to a second method to determine the battery SOH by using the SOH estimating unit 230, the ratio of the previous battery power value to the battery power value P is compared to a second threshold value. The SOH estimating unit 230 determines that the battery SOH is within the normal range when the ratio of the previous battery power to the battery power P is greater than the second threshold value. On the other hand, the SOH estimating unit 230 determines that the battery SOH is low, i.e., the battery 2 is out, when the ratio of the previous battery power to the battery power P is lower than the second threshold value. In an embodiment of the present invention, the first threshold value is set to determine the battery SOH according to the ratio of the fresh battery power value and the used battery power value P, which may vary according to a user's setting. The second threshold value is set to determine the battery SOH according to the ratio of the previous battery power and the battery power value P, which may also vary according to the user's setting.

Figure 3:
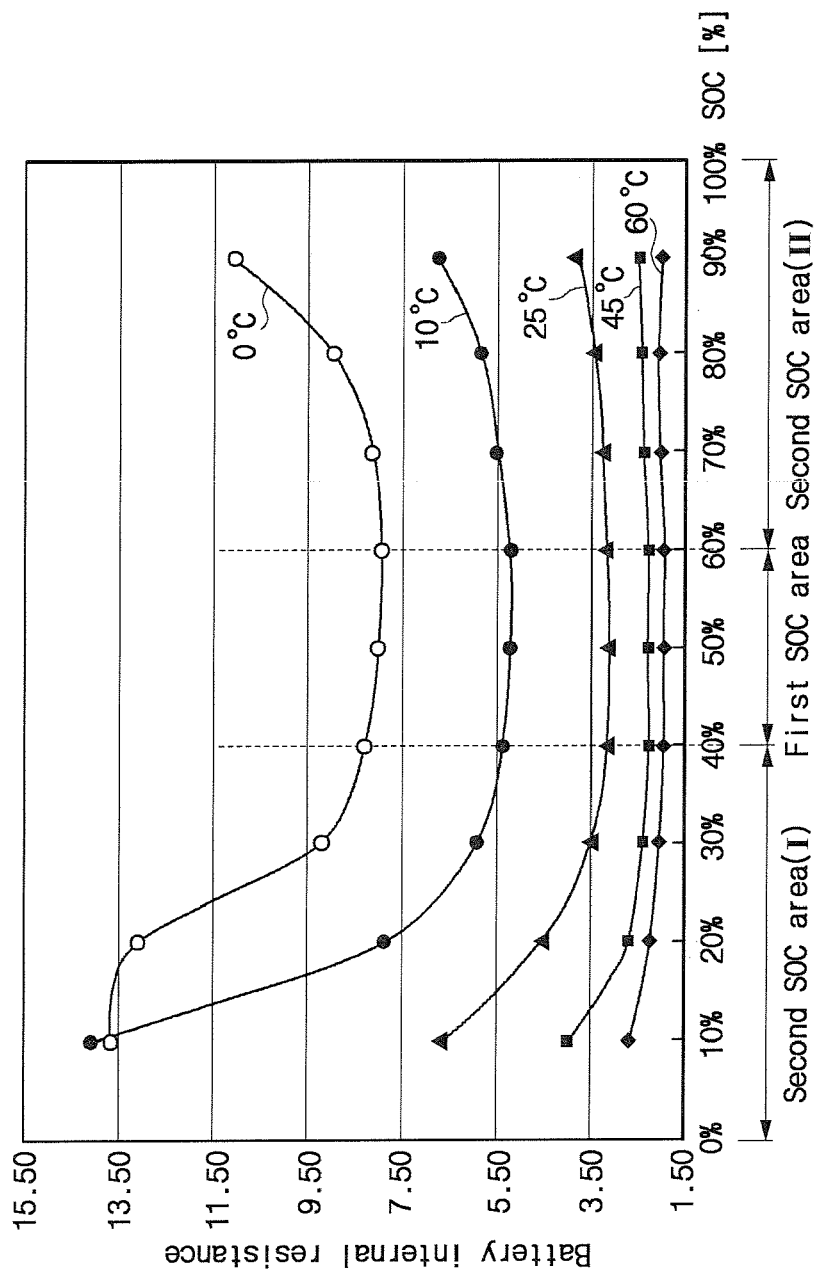
FIG. 3 shows a graph representing a battery temperature T and a battery internal resistance corresponding to a state of charge (SOC) according to an embodiment of the present invention.

FIG. 3 shows a graph representing the battery temperature T and the battery internal resistance corresponding to the SOC according to an embodiment of the present invention. As shown in FIG. 3, the estimated SOC is divided into the first SOC area, or range, and the second SOC area, or range, having sub-areas, or ranges, I and II. In this case, the estimated SOC is divided into the first and the second SOC areas according to a variation of the battery internal resistance for various battery temperatures. FIG. 3 depicts batteries at the temperatures of 0° C., 10° C., 25° C., 45° C. and 60° C. However, it is understood that other battery temperatures may also be used in accordance with aspects of the present invention.

The variation of the battery internal resistance, which corresponds to the variation of the estimated SOC, is minimized in the first SOC area, and is greater than the variation of the first SOC area in the second SOC area (I and II). Preferably, when an entire estimated SOC area is set from 0% to 100% of a charged state of the battery 2, the first SOC area is set from 40% to 60%, the second sub-area I is set from 0% to 40%, and the second sub-area II is set from 60% to 100%. The estimated SOC area is set as the first and second areas in an embodiment of the present invention, but the estimated SOC area is not limited thereto, and may instead have more than two areas having different ranges according to a user's setting.

In further detail, when the estimated SOC for a given battery temperature is estimated to be within the first SOC area, the corresponding battery internal resistance is calculated, and the calculated battery resistance is used to determine the battery SOH. However, when the estimated SOC is estimated to be within either of the second SOC sub-areas I or II, the battery SOH is not determined since the variation of the battery internal resistance according to the estimated SOC is great.

Figure 4:
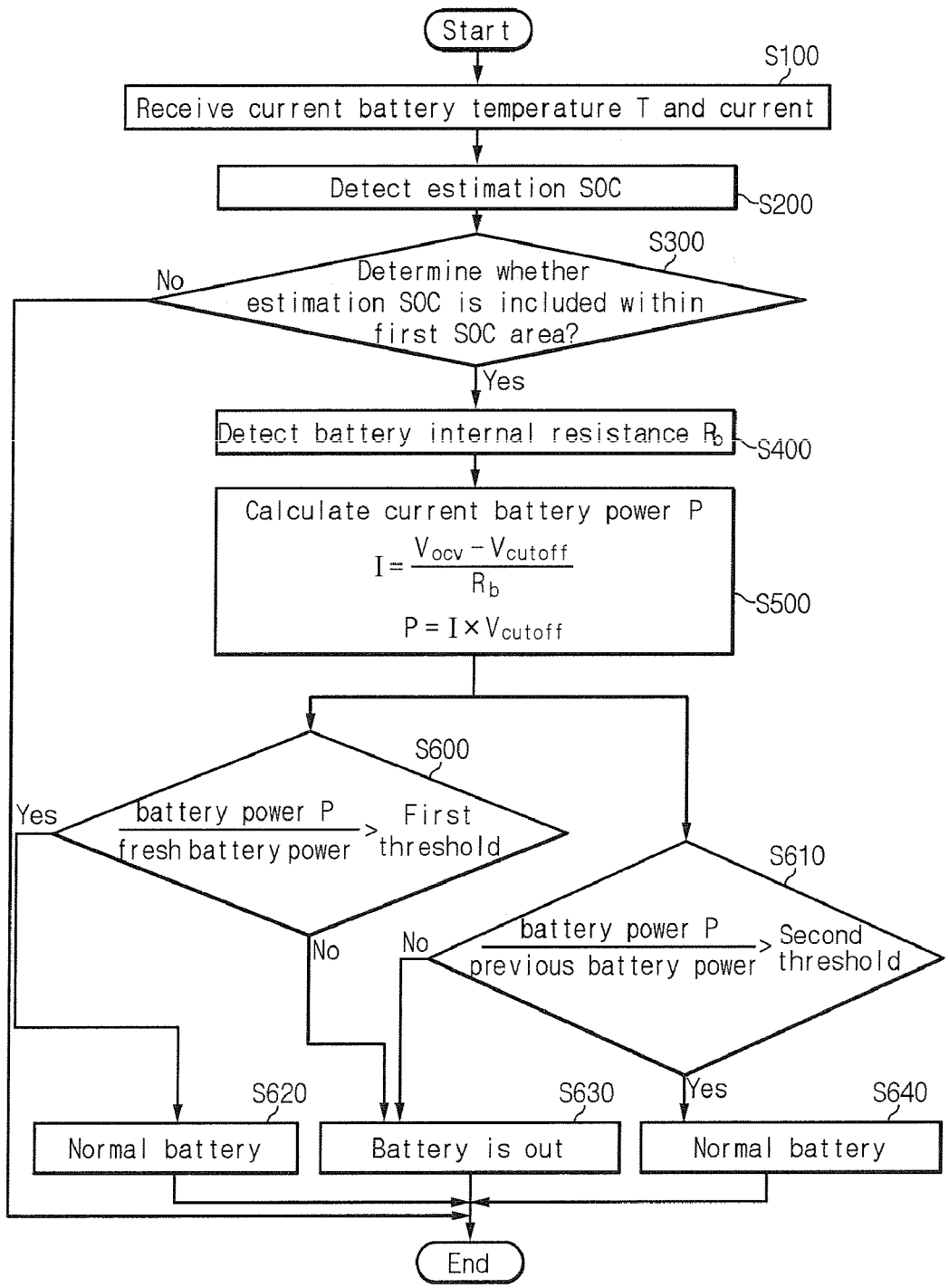
FIG. 4 shows a flowchart representing a state of health (SOH) estimation process by using the battery internal resistance according to an embodiment of the present invention.

FIG. 4 shows a flowchart representing an SOH estimation process using the battery internal resistance according to an embodiment of the present invention. First, the MCU 20 receives the current battery temperature T in operation S100. Subsequently, the MCU 20 detects the currently estimated SOC from the SOC estimating unit 210 in operation S200. Then, the MCU 20 determines whether the estimated SOC for the given battery temperature is included within the first SOC area in operation S300.

If the MCU 20 determines in operation S300 that the estimated SOC falls within either of the second SOC sub-areas I or II, the MCU 20 does not detect the battery internal resistance. If the MCU 20 determines in operation S300 that the estimated SOC falls within the first SOC area, the MCU 20 detects the battery internal resistance corresponding to the estimated SOC and the current battery temperature T in operation S400. Then, in operation S500, the MCU 20 uses the detected battery internal resistance to calculate the maximum discharge current I of the battery 2 by using Equation 1:

$$I = \frac{Vocv - Vcutoff}{Rb} \qquad \text{[Equation 1]}$$

Then, also in operation S500, the MCU 20 uses the calculated maximum discharge current I to calculate the battery power P by using Equation 2.

$$P = I \times Vcutoff \qquad \text{[Equation 2]}$$

The MCU 20 compares the ratio of the battery power P to the fresh battery power and the first threshold value in operation S600.

When the ratio of the battery power P to the fresh battery power is greater than the first threshold value in operation S600, the MCU 20 determines in operation S620 that the battery SOH is included within the normal range. When the ratio of the battery power P to the fresh battery power is lower than the first threshold value in operation S600, the MCU 20 determines in operation S630 that the battery SOH falls below the normal range, and that the battery is depleted.

The MCU 20 compares the ratio of the battery power P to the previous battery power and the second threshold value in operation S610.

When the ratio of the battery power P to the previous battery power is greater than the second threshold value in operation S610, the MCU 20 determines in operation S640 that the battery SOH is included within the normal range. On the other hand, when the ratio of the battery power P to the previous battery power is lower than the second threshold value in operation S610, the MCU 20 determines in operation S630 that the battery SOH falls below the normal range, and that the battery 2 is depleted. Although FIG. 4 depicts an SOH estimation process that compares the calculated battery power P to both a fresh battery power in operation S600 and a previous battery power in operation S610 to determine an SOH, the invention does not require that both of these comparisons need to be made. Instead, only one of these comparisons can be made, or more than two comparisons can be made.

As described above, according to an embodiment of the present invention, since the battery internal resistance is detected when the battery estimated SOC is included within the first SOC area, a more precise battery internal resistance may be detected, and the battery SOH may therefore be more precisely determined.

While not required in all aspects, aspects of the invention can be implemented using a computer program encoded on a medium readable by a computer. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

In the battery management system according to an embodiment of the present invention and the driving method thereof, when the battery estimated SOC is included within the first SOC area for a given battery temperature T, the battery internal resistance corresponding to the estimated SOC and the current battery temperature T is calculated, and the battery SOH may therefore be more precisely estimated.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A battery management system to manage a battery, comprising:
   a sensing unit to measure a battery temperature and a battery current; and
   a main control unit (MCU) to estimate a state of charge (SOC) based on the battery current; to calculate a battery internal resistance corresponding to the estimated (SOC) and the battery temperatures, only when the estimated SOC is determined to be within an SOC area; and to estimate a battery state of health (SOH) using the battery internal resistance.

2. The battery management system of claim 1, wherein the SOC area corresponds to an SOC range of from 40% to 60%.

3. The battery management system of claim 2, wherein the MCU uses:

$$I = \frac{Vocv - Vcutoff}{Rb}$$

to calculate a maximum discharge current of the battery;
   uses P=I×Vcutoff to calculate a battery power value; and
   uses the calculated maximum discharge current and the battery power value to estimate the battery SOH,
   wherein I denotes the maximum discharge current, Vocv denotes an open circuit voltage of the battery in a key-on state, Vcutoff denotes a permissible low battery voltage, Rb denotes the battery internal resistance, and P denotes the battery power value.

4. The battery management system of claim 3, wherein:
   the MCU determines that the battery SOH is included within a normal range, when a ratio of the battery power value P to a fresh battery power value is greater than a first threshold value; and
   determines that the battery is depleted when the ratio of the battery power value P to the fresh battery power value is lower than the first threshold value.

5. The battery management system of claim 4, wherein:
   the MCU determines that the battery SOH is included within the normal range, when a ratio of the battery power value P to a previous battery power value is greater than a second threshold value; and
   determines that the battery is depleted, when the ratio of the battery power value P to the previous battery power value is lower than the second threshold value.

6. A driving method of a battery management system which manages a battery, the driving method comprising:

determining whether an estimated state of charge (SOC) of the battery is included within an SOC area corresponding to a temperature of the battery;

calculating a battery internal resistance corresponding to the estimated SOC and the battery temperature, only when the estimated SOC is determined to be within the SOC area; and determining a battery state of health (SOH) based on the battery internal resistance.

7. The driving method of claim 6, wherein the SOC area corresponds to an SOC range of from 40% to 60%.

8. The driving method of claim 7, wherein the determining of the battery SOH comprises:

calculating a maximum discharge current of the battery by using:

$$I = \frac{Vocv - Vcutoff}{Rb};$$

and calculating a battery power value by using:

$P = I \times Vcutoff,$ wherein I denotes the maximum discharge current, Vocv denotes an open circuit voltage of the battery in a key-on state, Vcutoff denotes a permissible low battery voltage, Rb denotes the battery internal resistance, and P denotes the battery power value.

9. The driving method of claim 6, wherein the determining of the battery SOH comprises:

determining that the battery SOH is included within a normal range, when a ratio of a battery power value to a fresh battery power value is greater than a first threshold value; and determining that the battery is depleted, when the ratio of the battery power value to the fresh battery power value is lower than the first threshold value.

10. The driving method of claim 6, wherein the determining of the battery SOH comprises:

determining that the battery SOH is included within a normal range when a ratio of a battery power value to a previous battery power value is greater than a second threshold value; and determining that the battery is depleted when the ratio of the battery power value to the previous battery power value is lower than the second threshold value.

11. A battery management system to manage a battery, comprising:

a sensing unit to measure a battery current; and a main control unit (MCU) to estimate a state of charge (SOC) of the battery, based on the battery current, and to calculate an internal resistance of the battery, only when the estimated SOC is within an SOC range of 40% and 60%.

12. The battery management system of claim 11, wherein the sensing unit further measures a temperature of the battery.

13. The battery management system of claim 12, wherein the MCU calculates the battery internal resistance matching the estimated SOC for the battery temperature to a battery internal resistance.

14. The battery management system of claim 13, wherein the MCU calculates a maximum discharge current of the battery using:

$$I = \frac{Vocv - Vcutoff}{Rb},$$

calculates a battery power value using:

$P = I \times Vcutoff,$ and uses the maximum discharge current and the battery power value to estimate a battery state of health (SOH), wherein I denotes the maximum discharge current, Vocv denotes an open circuit voltage of the battery in a key-on state, Vcutoff denotes a permissible low battery voltage, Rb denotes the battery internal resistance, and P denotes the battery power value.

15. The battery management system of claim 14, wherein:

the MCU determines that the battery SOH is included within a normal range, when a ratio of the battery power value P to a fresh battery power value is greater than a first threshold value; and determines that the battery is depleted, when the ratio of the battery power value P to the fresh battery power value is lower than the first threshold value.

16. The battery management system of claim 14, wherein:

the MCU determines that the battery SOH is included within the normal range, when a ratio of the battery power value P to a previous battery power value is greater than a second threshold value; and determines that the battery is depleted, when the ratio of the battery power value P to the previous battery power value is lower than the second threshold value.

17. A driving method of a battery management system which manages a battery, the driving method comprising:

measuring a current of the battery;

estimating a state of charge (SOC) of the battery, based on the current; and calculating an internal resistance of the battery according to the estimated SOC and a temperature of the battery, only when the estimated SOC is within an SOC range.

* * * * *

UNITED STATES PATENT AND TRADEMARK OFFICE
CERTIFICATE OF CORRECTION

PATENT NO. : 7,684,942 B2  Page 1 of 1
APPLICATION NO. : 11/851032
DATED : March 23, 2010
INVENTOR(S) : Han-Seok Yun et al.

It is certified that error appears in the above-identified patent and that said Letters Patent is hereby corrected as shown below:

Column 10, line 27, change "temperatures" to --temperature--.

Signed and Sealed this

Twenty-seventh Day of July, 2010

David J. Kappos
*Director of the United States Patent and Trademark Office*